United States Patent [19]

Plus et al.

[11] Patent Number: 4,918,498
[45] Date of Patent: *Apr. 17, 1990

[54] EDGELESS SEMICONDUCTOR DEVICE

[75] Inventors: Dora Plus, South Bound Brook; Alfred C. Ipri, Hopewell Township, Mercer County, both of N.J.

[73] Assignee: General Electric Company, Schenectady, N.Y.

[*] Notice: The portion of the term of this patent subsequent to Sep. 5, 2006 has been disclaimed.

[21] Appl. No.: 262,061

[22] Filed: Oct. 24, 1988

Related U.S. Application Data

[63] Continuation of Ser. No. 48,706, May 12, 1987, abandoned.

[51] Int. Cl.$^4$ .............................................. H01L 27/12
[52] U.S. Cl. ................................. 357/23.7; 357/23.11
[58] Field of Search ................. 357/42, 4, 23.7, 23.11, 357/49, 50

[56] References Cited

U.S. PATENT DOCUMENTS

| | | | |
|---|---|---|---|
| 3,890,632 | 6/1975 | Ham et al. | 357/23 |
| 4,015,279 | 3/1977 | Ham | 357/23 |
| 4,054,894 | 10/1977 | Heagerty et al. | 357/23 |
| 4,054,895 | 10/1977 | Ham | 357/23 |
| 4,063,274 | 12/1977 | Dingwell | 357/42 |
| 4,070,211 | 1/1978 | Harari | 148/187 |
| 4,178,191 | 12/1979 | Flatley | 148/1.5 |
| 4,185,319 | 1/1980 | Stewart | 365/185 |
| 4,252,574 | 2/1981 | Fabula | 148/1.5 |
| 4,393,572 | 7/1983 | Policastro et al. | 29/571 |
| 4,489,339 | 12/1984 | Uchida | 357/23.7 |
| 4,547,790 | 10/1985 | Egawa | 357/42 |
| 4,864,380 | 9/1989 | Plus et al. | 357/42 |

OTHER PUBLICATIONS

Stewart, "CMOS/SOS EAROM Memory Arrays", *IEEE Journal of Solid-State Circuits*, vol. SC-14, No. 5, pp. 860-864, Oct. 1979.

*Primary Examiner*—William D. Larkins
*Attorney, Agent, or Firm*—Henry I. Steckler; James C. Davis, Jr.; Paul R. Webb, II

[57] ABSTRACT

A semiconductor device comprising an island of semiconductor material disposed on an insulating substrate is disclosed. A MOS transistor is formed in the semiconductor material, but the gate electrode does not extend over any sidewall of the silicon island. In order to electrically isolate the source and drain regions in the areas of the silicon island not subtended by the gate electrode, a pair of diodes in series is used to eliminate the shorting paths.

5 Claims, 5 Drawing Sheets

EDGELESS SEMICONDUCTOR DEVICE

This application is a continuation of application Ser. No. 07/048,706, filed May 12, 1987 now abandoned.

The present invention relates to a semiconductor device which eliminates the parasitic edge transistors.

BACKGROUND OF THE INVENTION

Silicon-on-insulator (SOI) semiconductor devices generally include a silicon island formed on the surface of an insulating material. A metal-oxide-semiconductor (MOS) transistor is formed in and on the silicon island. When the insulating material is a sapphire substrate, the structure is known as a silicon-on-sapphire (SOS) semiconductor device. However, the insulating material may also be a layer of silicon dioxide which is disposed on a semiconductor substrate. MOS/SOI transistors generally have higher speed and improved radiation hardness in comparison with MOS transistors formed in bulk silicon.

Referring now to FIG. 1, a conventional silicon-on-insulator semiconductor device is generally designated as 10. The device 10 is a silicon-on-sapphire semiconductor device because a silicon island 12 is formed on a sapphire substrate 14. The silicon island 12 is doped P-type; however, it also contains N-type source and drain regions 13 and 15, respectively. A gate oxide layer (not shown) is formed on the surfaces of the silicon island 12 under at least the gate electrode 20. The device 10 actually consists of three transistors in parallel. The first transistor is formed on the top surface 16 of the silicon island 12. Two transistors are also formed along the opposed sidewalls 18 of the silicon island 12. The opposed sidewalls 18 lie under the gate electrode 20 and extend along the channel length of the SOS device. The transistors formed along the opposed sidewalls 18 are commonly referred to as parasitic edge transistors.

The parasitic edge transistors can have a lower threshold voltage than the top transistor. When the parasitic edge transistors prematurely turn on, leakage currents are allowed to pass through the device. Additionally, when an N-channel SOI device is subjected to ionizing radiation, the edge transistor problem increases. Positive charges accumulate between the gate oxide and the silicon island. These positive charges shift the threshold voltage of both the top and edge transistors. However, the threshold voltage shift is greater in the parasitic edge transistors. Thus, the edge transistors turn on well before the top transistor and this is a major cause of post-radiation leakage currents in SOI devices. Finally, the dielectric strength of the gate oxide along the edge transistors is usually poor. This can be attributed to the non-uniform thickness of the gate oxide along the sidewall of the silicon island and the increased electrical field around the edge of the silicon island. The poor dielectric strength of the gate oxide on the parasitic edge transistor and the high electrical field around the sharp angled island edge lead to premature gate breakdown.

In order to avoid the problem of the lower threshold voltage of the parasitic edge transistors, the sidewalls of the silicon island are doped heavier than the channel region. This increases the threshold voltage of the edge transistor and thus reduces the post-radiation leakage currents. One such technique for doping the sidewalls of the silicon island is described in commonly assigned U.S. Pat. No. 3,890,632 entitled "Stablized Semiconductor Devices and Method of Making The Same" which issued to W. E. Ham et al. on June 17, 1975. In an N-channel device, the sloped sidewalls of the silicon island are ion implanted with boron. However, the plasma etching techniques which are used today to define the silicon islands typically form vertical sidewalls. It is difficult to uniformly dope the vertical walls of a silicon island using the ion implantation technique described by Ham et al.

Concentric edgeless semiconductor devices have also been developed to avoid the parasitic edge-transistor problem. An example of such a device can be found in commonly assigned U.S. Pat. No. 4,185,319 entitled "Non-Volatile Memory Device" issued to R. G. Stewart on Jan. 22, 1980. The drain region of the transistor is enclosed by a frame-like gate electrode which is in turn surrounded by a frame-like source region. The frame-like gate electrode is disposed totally on top of the silicon island; therefore, the parasitic edge transistors are eliminated. Although the structure is indeed edgeless, it is quite large and can be only used in integrated circuits or in portions of integrated circuits where area considerations are unimportant. There is a need in the art for small edgeless semiconductor devices so that high packing densities can be achieved in integrated circuits.

SUMMARY OF THE INVENTION

The present invention includes a semiconductor device with an island of semiconductor material disposed on an insulating substrate. A gate insulating layer and a gate electrode are both disposed over the island of semiconductor material. The gate electrode is disposed over the island such that it does not overlie the common boundary between the top surface and at least one sidewall of the island of semiconductor material. A means is also disposed in the island of semiconductor material for substantially eliminating the shorting paths between the source and drain regions in the areas of the island not subtended by the gate electrode.

DETAILED DESCRIPTION OF THE PREFERRED EMBODIMENT

The present invention will be described using single-crystalline silicon as the semiconductor material which is disposed on an insulating substrate of single-crystalline sapphire. However, it should be understood that other conventional semiconductor materials, such as other forms of silicon and IIb–VIa and IIIa–Va semiconductor compounds, may be substituted for single-crystalline silicon. Additionally, other conventional insulator substrates, such as spinel, beryllium oxide, and silicon dioxide disposed on a semiconductor material, may be substituted for sapphire.

Figure 2A:
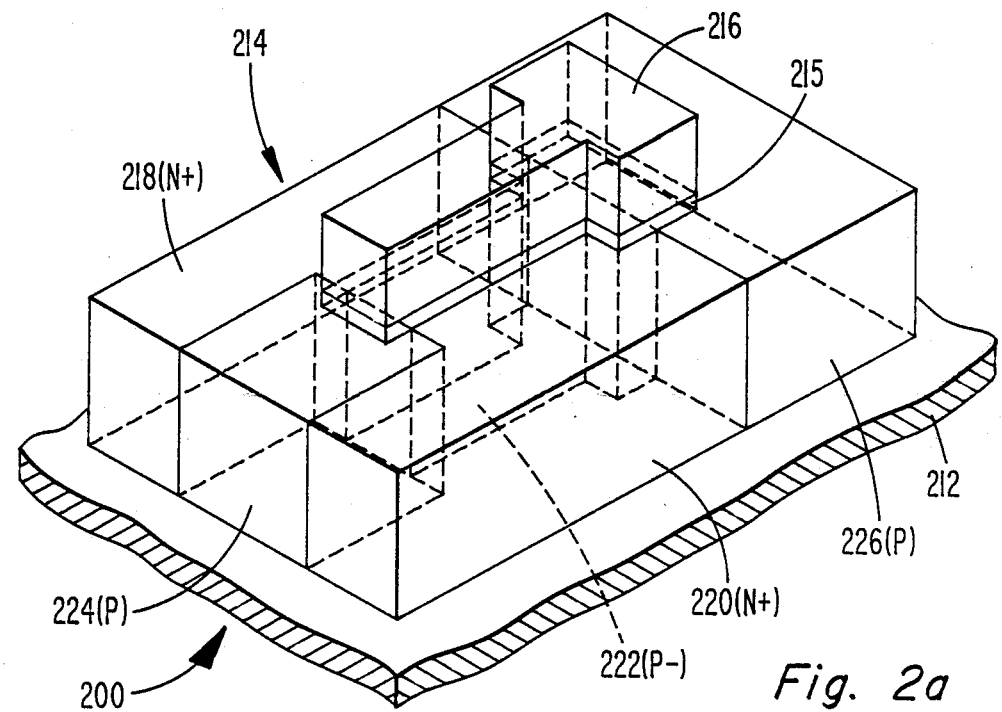
FIGS. 2a and 2b are isometric and plan views, respectively, of the first embodiment of the present invention.
Figure 2B:
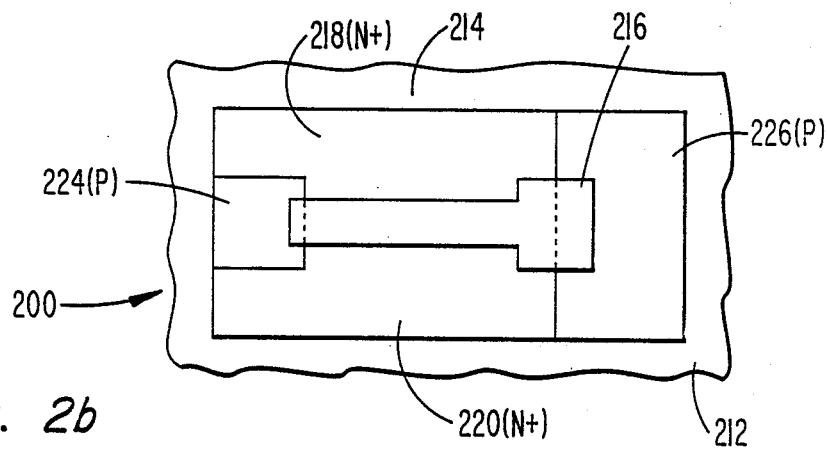

Referring now to FIGS. 2a and 2b, the N-channel SOS transistor of the first embodiment of the present invention is generally designated as 200. The transistor 200 includes a single-crystalline sapphire substrate 212 upon which is disposed a lightly doped P-type (P−) single crystalline silicon island 214 having an impurity concentration of about $10^{16}$ cm$^{-3}$. The silicon island 214 has a thickness of about 0.5 micrometer. A gate electrode 216, such as N-type polycrystalline silicon, is disposed over the top surface of the silicon island 214. A gate insulating layer 215, such as silicon dioxide, is disposed between the gate electrode 216 and the top surface of the silicon island 214. The gate insulating layer 215 may also be disposed over all of the exposed surfaces of the silicon island 214.

The SOS transistor 200 also includes heavily doped N-type (N+) source and drain regions 218 and 220, respectively, which extend from the top surface of the silicon island 214 to the interface between the silicon island 214 and the sapphire substrate 212. The heavily doped N-type (N+) source 218 and drain 220 regions each typically have an impurity concentration of about $10^{20}$ cm$^{-3}$. The source and drain regions 218 and 220, respectively, are separated by a lightly doped P-type (P−) channel region 222 having an impurity concentration of about $10^{16}$ cm$^{-3}$.

In order to eliminate the shorting paths that would otherwise exist between the source 218 and drain 220 regions in the areas of the silicon island 214 which are not subtended by the gate electrode 216, moderately doped P-type (P) regions 224 and 226 extend from under a portion of the gate electrode 216 to the sidewalls which are substantially parallel to the direction of the channel length. Typically, the moderately doped P-type (P) regions 224 and 226 have an impurity concentration of about $10^{18}$ cm$^{-3}$. These P-type regions 224 and 226 extend from the top surface of the silicon island 214 to the interface between the silicon island 214 and the sapphire substrate 212. Additionally, the P-type regions 224 and 226 contact each of the source 218 and drain 220 regions. The junctions between the N+ source and drain regions 218 and 220, respectively, and the P regions 224 and 226 form N+/P diodes. For example, N+/P diodes are formed between the N+ source region 218 and the P region 224 and between the N+ drain region 220 and the P region 224. These N+/P diodes are in a back-to-back series arrangement with respect to the source 218 and drain 220 regions and serve as the means for eliminating the shorting paths between the source and drain regions 218 and 220, respectfully. Similarly, the P region 226 forms a pair of N+/P diodes in a back-to-back series arrangement with respect to the N+ source 218 and the N+ drain 220 regions in the area adjacent the enlarged pad portion of the gate electrode 216.

Figure 2C:
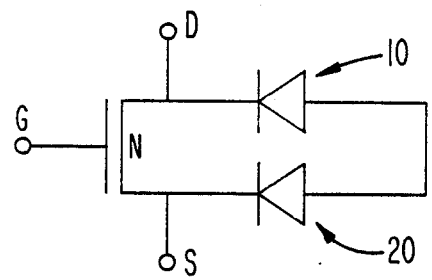
FIG. 2c is an electrical schematic drawing illustrating the means used in the present invention for eliminating the shorting paths between the source and drain regions.

FIG. 2c is an electrical schematic illustrating the means used in the present invention for eliminating the shorting paths between the source (S) and drain (D) regions of the N-channel transistor 200. As shown in this FIGURE, a pair of diodes 10 and 20 are disposed between the source (S) and drain (D) regions in a back-to-back series arrangement so as to eliminate the shorting paths that would otherwise exist between the source (S) and drain (D) regions. Since the source (S) is connected to the lowest voltage potential, typically ground, the N+/P diode 20, adjacent the source (S), is forward biased. However, the diode 10, adjacent the drain (D), is reverse biased and this is the diode which actually eliminates the shorting paths between the source (S) and drain (D) regions. FIG. 2c only shows a single pair of diodes in a back-to-back relationship to eliminate the shorting paths in the areas of the silicon island next to one end of the gate electrode; however, a second pair of diodes in a back-to-back relationship is also disposed in the silicon island adjacent the opposite end of the gate electrode.

The SOS transistor illustrated in FIGS. 2a and 2b is typically fabricated by first forming the lightly doped P-type silicon island 214 on the sapphire substrate 212 using conventional SOS processing techniques. Then, the lightly doped silicon island 214 is masked so as to only expose the portions of the island 214 where the moderately doped P-type regions (P) 224 and 226 are to be located. Boron is implanted into the island using an energy of about 40 keV and a dosage of about $5 \times 10^{13}$ cm$^{-2}$ to form the moderately doped P-type (P) regions 224 and 226. The masking layer over the silicon island 214 is then removed and the gate insulating layer 215 and the gate electrode 216 are formed using conventional techniques. Then, the moderately doped P-type (P) regions 224 and 226 are covered with a masking layer, such as a photoresist, while phosphorus is implanted at an energy of about 120 keV with a dosage of about $5 \times 10^{15}$ cm$^{-2}$ to form the N+ source 218 and N+ drain 220 regions.

As an alternative to the device illustrated in FIGS. 2a and 2b, the P-type regions 224 and 226 may be formed after the gate electrode 216 has been deposited and defined. When using this fabrication technique, the P-type regions 224 and 226 will not extend under the gate electrode as shown in FIGS. 2a and 2b. This technique will typically be used for fabricating complementary metal-oxide-semiconductor (CMOS) integrated circuits because the P-type regions 224 and 226 will be formed simultaneously during the implant step used to form the source and drain regions for the P-channel device. When using this alternative technique, the P-type regions 224 and 226 will typically be heavily doped (P+) and have an impurity concentration of about $10^{20}$ cm$^{-3}$. Thus, N+/P+ diodes are formed. These N+/P+ diodes have a lower breakdown voltage when compared to the N+/P diodes formed when the P-type regions 224 and 226 are not fabricated simultaneously with the source and drain regions for the NMOS device.

Figure 3A:
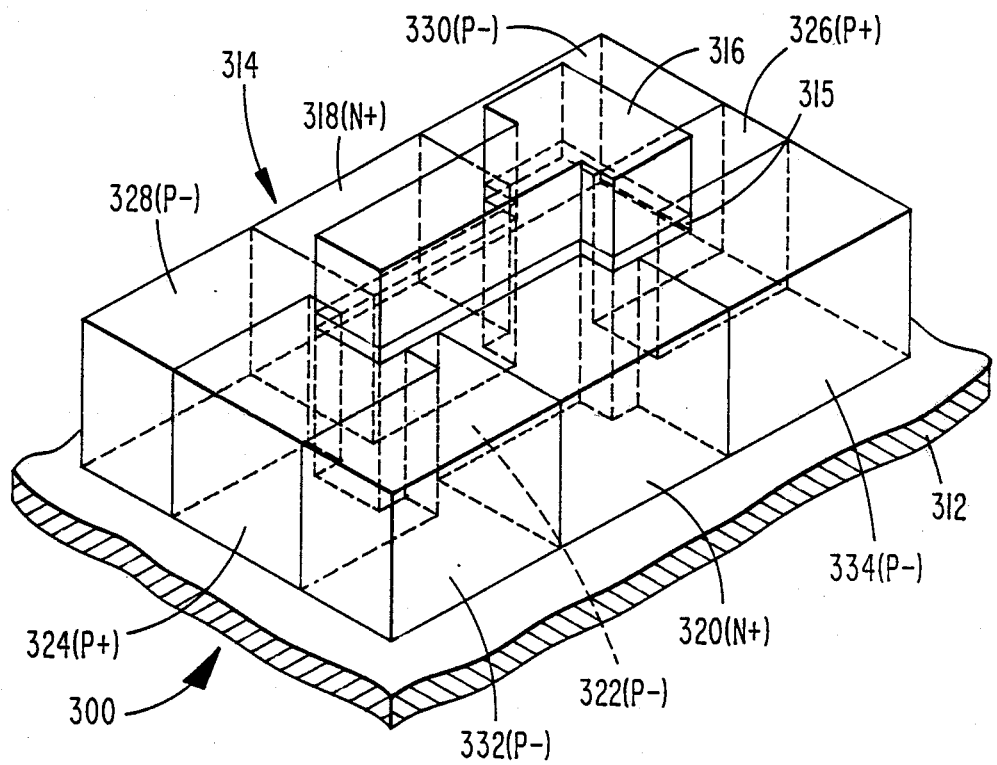
FIGS. 3a and 3b are isometric and plan views, respectively, of the second embodiment of the present invention.
Figure 3B:
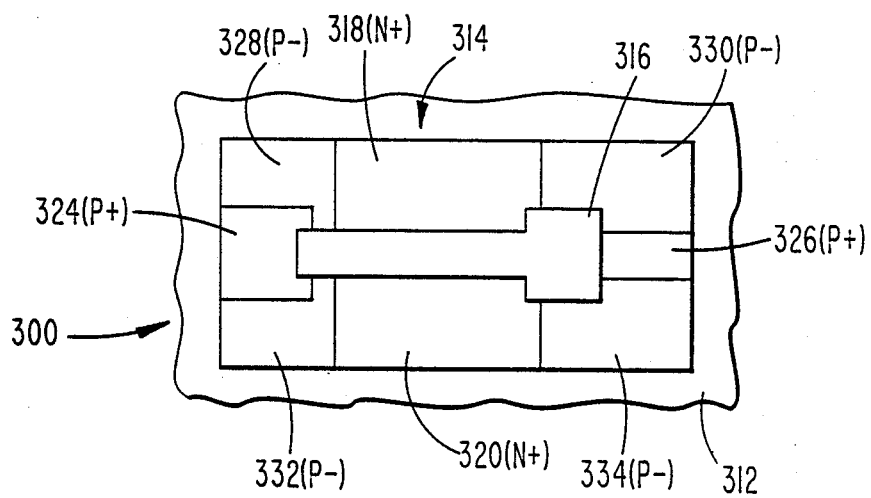

Turning now to FIGS. 3a and 3b, the second embodiment of the present invention is an N-channel SOS transistor generally designated as 300. The SOS transistor 300 includes a sapphire substrate 312 upon which is disposed a lightly doped P-type (P−) silicon island 314. This device also includes a gate insulating layer 315, such as silicon dioxide, disposed under at least the gate electrode 316. As discussed earlier, the gate insulating layer 315 may be disposed over all the exposed surfaces of the P-type silicon island 314. Self-aligned heavily doped N-type (N+) source and drain regions 318 and 320, respectively, are disposed in the silicon island 314 and separated by the lightly doped P-type (P−) channel region 322. The heavily doped (N+) source and drain regions 318 and 320, respectively, each have an impurity concentration of about $10^{20}$ cm$^{-3}$, while the lightly doped P-type (P−) channel region 322 typically has a P-type impurity concentration of about $10^{16}$ cm$^{-3}$.

The transistor 300 also includes heavily doped P-type (P+) regions 324 and 326 disposed in the silicon island 314 between the sidewalls which are parallel to the channel length and the ends of the gate electrode 316. The heavily doped P-type (P+) regions 324 and 326 each have an impurity concentration of about $10^{20}$ cm$^{-3}$. However, these heavily doped P-type regions 324 and 326 are spaced from the heavily doped N-type (N+) source and drain regions 318 and 320, respectively, by portions 328, 330, 332 and 334 of the lightly doped P-type (P−) silicon island 314. These P− portions 328, 330, 332 and 334 each have a P-type impurity concentration of about $10^{16}$ cm$^{-3}$. The P− portions 328 and 330 contact the source region 318 while the P− portions 332 and 334 contact the drain region 320. The junctions between the N+ source 318 and drain 320 regions and the P− portions 328, 330, 332 ad 334 form N+/P− diodes.

The N+/P− diodes are in a back-to-back series arrangement with respect to the source 318 and drain 320 regions and are used to eliminate the shorting paths between the source and drain regions in the areas of the island not subtended by the gate electrode 316. As discussed earlier with regard to FIG. 2c, the N+/P− diodes in the device 300 adjacent the source region 318 are also forward biased while the N+/P− diodes adjacent the drain region 320 are reversed biased. The device 300 has a much higher breakdown voltage than the device 200, illustrated in FIGS. 2a and 2b, because of the use of N+/P− diodes, rather than N+/P or N+/P+ diodes, adjacent the drain region 320. The source 318 and drain 320 regions are reversible thereby allowing the device 300 to be used in bilateral transmission gates. Also, the heavily doped P-type (P+) regions 324 and 326 guarantee electrical isolation between the source 318 and drain 320 regions when surface inversion occurs in the lightly doped P-type (P−) portions 328, 330, 332 and 334.

The device 300 is manufactured in much the same way as described earlier with regard to FIGS. 2a and 2b. The heavily doped P-type (P+) regions 324 and 326 are formed before or after the gate electrode 316 has been defined. However, to make the device 300 shown in FIGS. 3a and 3b, the heavily doped P-type (P+) regions 324 and 326 are formed after the gate electrode has been defined. Typically, the gate insulating layer and gate electrode would be formed over the lightly doped P-type (P−) silicon island 314 having a thickness of about 0.5 micrometer. Then, all areas other than the regions 324 and 326 would be masked with a suitable photoresist. Boron would then be ion implanted into the silicon island 314 using an implant energy of about 40 keV and a dosage of about $5 \times 10^{15}$ cm$^{-2}$ to form the heavily doped P-type (P+) regions 324 and 326. The photoresist masking layer would then be removed. An additional photoresist masking layer would be formed over the silicon island 314 so as to mask all portions except for those corresponding to the location of the source and drain regions 318 and 320, respectively. Then, phosphorus would be implanted into the silicon island 314 using an implant energy of about 120 keV and a dosage of about $5 \times 10^{15}$ cm$^{-2}$ to form the heavily doped (N+) source and drain regions 318 and 320, respectively. It should be noted that the lightly doped P-type (P−) regions 328, 330, 332 and 334 are part of the original lightly doped P-type (P−) silicon island 314. These regions are formed by selectively masking these areas during the implant sequence used to form both the heavily doped P-type (P+) regions 324 and 326 and the N-type source and drain regions 318 and 320, respectively.

Figure 4A:
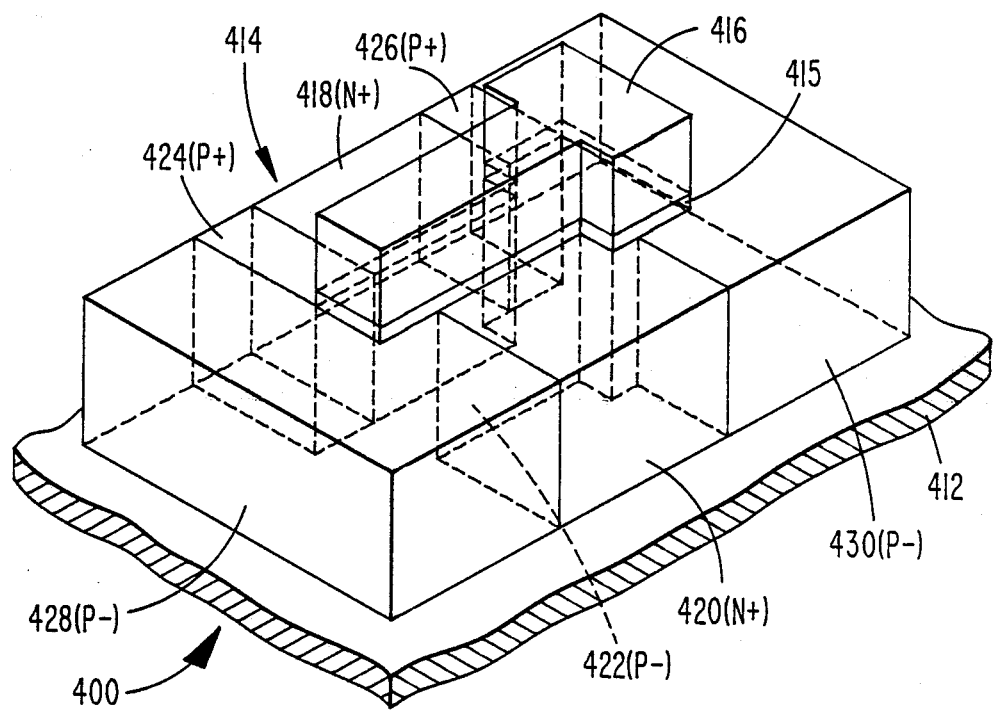
FIGS. 4a and 4b are isometric and plan views, respectively, of a third embodiment of the present invention.
Figure 4B:
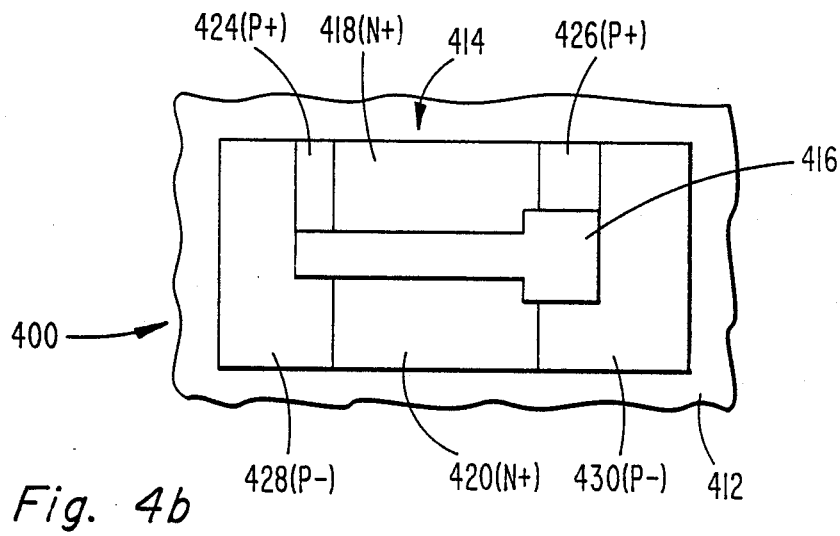

Referring now to FIGS. 4a and 4b, the third embodiment of the present invention is an N-channel SOS transistor generally designated as 400. This transistor 400 also includes a sapphire substrate 412 with a lightly doped P-type (P−) silicon island 414 disposed thereon. A gate insulating layer 415, such as silicon dioxide, and a gate electrode 416, such as N-type polycrystalline silicon, are disposed over the silicon island 414. The transistor 400 also includes heavily doped N-type (N+) source and drain regions 418 and 420, respectively, having an impurity concentration of about $10^{20}$ cm$^{-3}$. Heavily doped P-type (P+) regions 424 and 426 are disposed in the silicon island 414 such that they contact the source region 418. These heavily doped P-type (P+) regions 424 and 426 have an impurity concentration of about $10^{20}$ cm$^{-3}$. The heavily doped P-type regions 424 and 426 are separated from the drain region 420 by lightly doped P-type (P−) regions 428 and 430. The lightly doped P-type (P−) regions 428 and 430 contact the drain region 420. These lightly doped P-type (P−) regions 428 and 430 have an impurity concentration of about $10^{16}$ cm$^{-3}$. A channel region 422, having a P-type impurity concentration of about $10^{16}$ cm$^{-3}$, is disposed under the gate electrode 416.

In the device 400, the junctions between the N+ source region 418 and the heavily doped P-type (P+) regions 424 and 426 form N+/P+ diodes. Also, the junctions between the N+ drain region 420 and the lightly doped P-type (P−) regions 428 and 430 form N+/P− diodes. These diodes are in a back-to-back series arrangement with respect to the source 418 and drain 420 regions. Since the source region 418 of this device is typically grounded, the N+/P+ diodes formed with the heavily doped P-type regions 424 and 426 are forward biased. The lightly doped P-type (P−) regions 428 and 430 forming N+/P− diodes with the drain region 420 are reversed biased. The N+/P− diodes formed with the drain region 420 eliminate the shorting paths which would otherwise exist between the source 418 and drain 420 regions in the areas of the silicon island 414 not subtended by the gate electrode 416. The structure shown in FIGS. 4a and 4b is not suitable for bilateral transmission gates since the source and drain regions are not reversible.

Figures 5A, 5B:
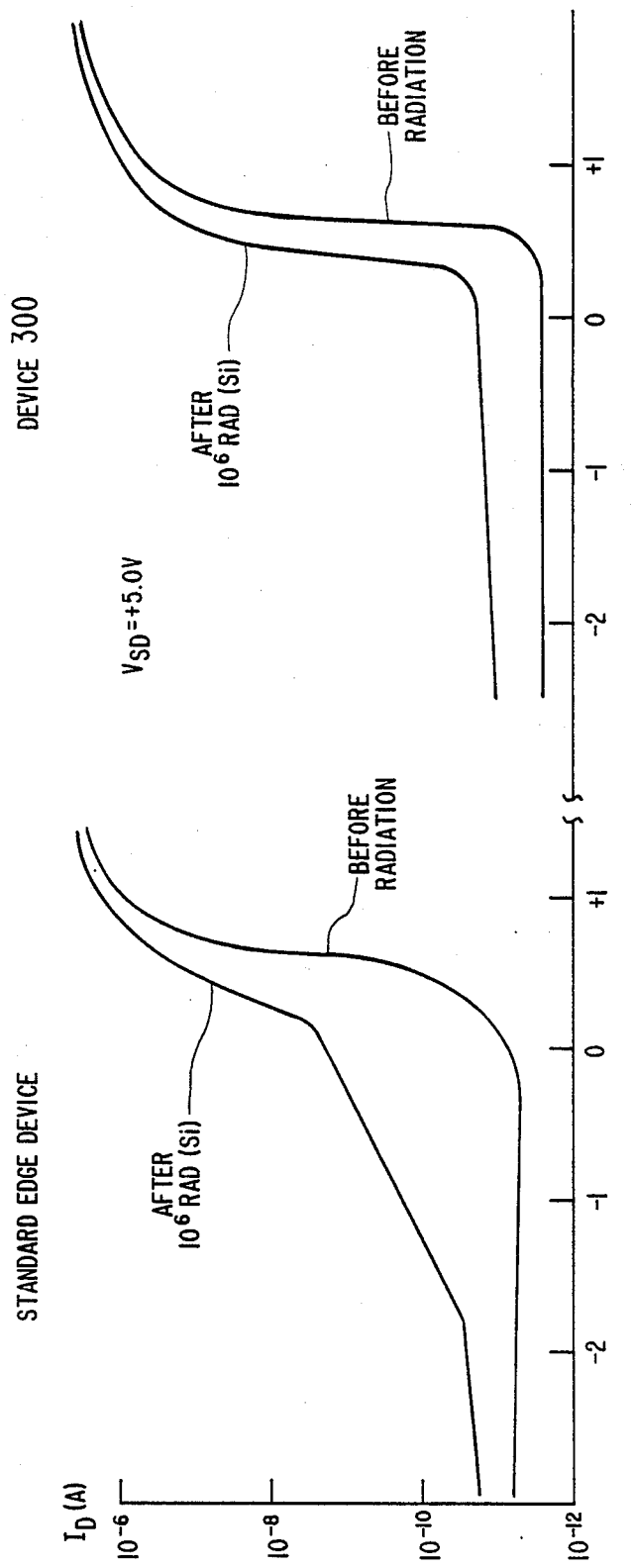
FIGS. 5a and 5b are graphs of the device characteristics of a standard transistor and the transistor of the present invention illustrated in FIGS. 3a and 3b.

FIGS. 5a and 5b illustrate the device characteristics of a standard N-channel SOS transistor and the edgeless N-channel SOS transistor illustrated in FIGS. 3a and 3b of the present invention. The device fabricated for achieving the data in FIG. 5a had a gate electrode which extended over the sidewalls of the silicon island. FIG. 5b illustrates the device characteristics for the transistor of the present invention, shown in FIGS. 3a and 3b, where N+/P− diodes in series were used to isolate the source and drain regions since the gate electrode did not extend over the sidewalls of the silicon island. In both devices, the source to drain voltage was +5 volts, the channel length was 1.25 micron, and the channel width was 8.0 microns. The doping concentrations of the source, drain and channel regions were the same for the devices used to obtain the data shown in FIGS. 5a and 5b.

As can be seen from FIG. 5a, where the drain current is plotted as a function of gate voltage and radiation dose, the initial leakage current of the standard device before irradiation is about $8 \times 10^{-12}$ A. In addition, the device exhibits a soft initial turn-on which is characteristic of the early turn-on of the edge transistor due to its lower threshold voltage. However, after $10^6$ RAD(Si) irradiation, three effects are observed. First, at the higher positive gate voltages, the post irradiation curve exhibits a parallel shift to higher currents for a given gate voltage. Secondly, at a gate voltage of around zero volts, the drain current is seen to monotonically decrease with decreasing gate voltage. This effect has been shown to be associated with excessive charge trapping along the transistor edge causing a substantial reduction in the edge transistor threshold voltage. Finally, the zero gate voltage leakage current is about $1.5 \times 10^{-9}$ A. Thus, the ratio of post radiation leakage to pre-radiation leakage is about a factor of about 100.

Turning now to FIG. 5b, the drain current is also plotted as a function of gate voltage and radiation dose for the device 300 illustrated in FIGS. 3a and 3b of the present invention. As can be seen from the pre-radiation curve, this device does not exhibit the soft turn-on characteristics due to the absence of the edge transistor. After radiation, the transistor of the present invention exhibits a parallel shift due to charge trapping in the gate oxide, but the additional shift due to trapping along the edge is no longer present. As can be seen, the pre-radiation leakage current is about $2 \times 10^{-12}$ A while the post radiation leakage current is about $1.5 \times 10^{-11}$ A. Thus, the ratio of post radiation leakage to pre-radiation leakage is now only a factor of about 10.

Figure 1:
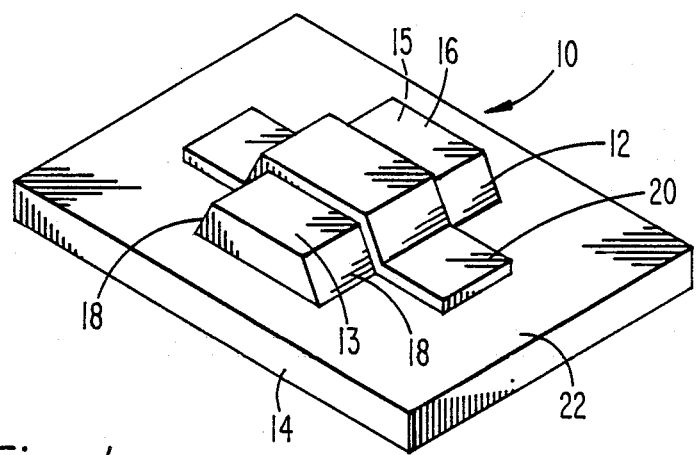
FIG. 1 is an isometric view of a conventional N-channel SOS semiconductor device illustrating the parasitic edge transistors.
Figure 6:
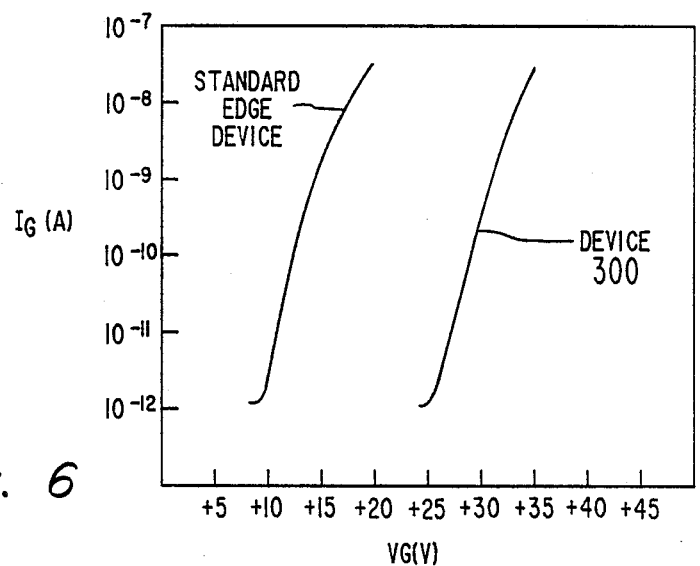
FIG. 6 is a graph illustrating the gate integrity characteristics of a standard transistor and the transistor of the present invention illustrated in FIGS. 3a and 3b.

FIG. 6 is a comparison of the gate integrity for the standard edge device used in obtaining the data shown in FIG. 5a and the edgeless device of the present invention used in obtaining the data shown in FIG. 5b. The gate current as a function of gate voltage was measured for both devices using a silicon dioxide gate dielectric having a thickness of about 35 nanometers. For the standard edge device, the gate electrode typically failed at about 20 volts. However, for the edgeless device of the present invention, the failure voltage increased to better than 35 volts. This can be attributed to the fact that the edgeless device of the present invention does not have the gate oxide along the the sidewall and the boundary between the top surface of the island and the sidewall.

Although the present invention to this point has been described using N-channel transistors, the present invention is also applicable to P-channel transistors. The P-channel transistors would have the same orientation as illustrated in FIGS. 2a through 4b except for the reversal of the impurity type of all the regions. Additionally, the present invention is also particularly applicable to the formation of CMOS integrated circuits. Specifically, with the devices illustrated in FIGS. 3a and 4a, the P-type regions 324 and 326 or 424 and 426 can be fabricated during the implant steps used to form the source and drain regions for the P-channel transistor. Thus, the present invention can be fabricated in a conventional CMOS processing sequence without the addition of any additional masking steps. Although the present invention has been illustrated using a substantially rectangular semiconductor island, other geometrical shapes, such as discs, could be substituted without departing from the scope of the invention.

We claim:

1. A common island semiconductor device comprising an island of a first conductivity type semiconductor material disposed on an insulating substrate, said island having a top surface and being completely surrounded by a peripheral sidewall, with a common boundary between said top surface and said sidewall;

said island being divided into a first conductivity type portion and two second conductivity type portions, with junctions between said first type portion and said second type portions, a gate electrode insulating overlying said island, and extending from a first termination point within said first type portion to a second termination point within said first type portion, said first termination point and said second termination point each being spaced from said sidewall, and said gate electrode lying entirely within and spaced from said common boundary, said first type conductivity portion having a first channel stop area extending from said first termination point to said common boundary, and a second channel stop area extending from said second termination point to said common boundary, and second conductivity type source and drain regions respectively within said second conductivity type portions, spaced from each other by the first conductivity type portion underlying said gate electrode and by said first conductivity type channel stop areas, said second conductivity type source region extending to said sidewall at a first location, and said second conductivity type drain region extending to said sidewall at a second location spaced from said first location.

2. A common island semiconductor device according to claim 1, wherein each of said first type channel stop areas contains a channel stop region of first conductivity type having an impurity concentration of at least about two orders of magnitude greater than said first type portion disposed therein and respectively extending generally from said first and second termination points to said common boundary, said channel stop regions being spaced from said second type source and said second type drain by portions of said first type portion.

3. A common island semiconductor device according to claim 1, wherein channel stop regions of first conductivity type having an impurity concentration of at least about two orders of magnitude greater than said first type portion are provided within said first type portion, said channel stop regions of first conductivity type extending from a part of said sidewall to said first and second termination points respectively and generally perpendicular to said gate electrode.

4. The common island semiconductor device of claim 1 wherein said first conductivity type is P type and said second conductivity type in N type.

5. The common island semiconductor device of claim 1 wherein said semiconductor material is silicon and said substrate is sapphire.

* * * * *